United States Patent [19]
Yang

[11] Patent Number: 5,838,695
[45] Date of Patent: Nov. 17, 1998

[54] METHOD AND APPARATUS FOR PERFORMING REED-SOLOMON PRODUCT-LIKE DECODING OF DATA IN CD-ROM FORMAT

[75] Inventor: Hsin-Lung Yang, Hsinchu, Taiwan

[73] Assignee: Winbond Electronics Corp., Taipei, Taiwan

[21] Appl. No.: 777,562

[22] Filed: Dec. 30, 1996

[51] Int. Cl.$^6$ .......................... H03M 13/00; G11B 20/18
[52] U.S. Cl. ............................................. 371/37.5
[58] Field of Search ............................................. 371/37.5

[56] References Cited

U.S. PATENT DOCUMENTS

| | | | |
|---|---|---|---|
| 4,998,252 | 3/1991 | Suzuki et al. | 371/37.5 |
| 5,404,347 | 4/1995 | Jeong | 369/83 |
| 5,408,477 | 4/1995 | Okada et al. | 371/37.4 |
| 5,499,252 | 3/1996 | Watanabe | 371/40.1 |

Primary Examiner—Stephen M. Baker

[57] ABSTRACT

A method and apparatus processing a Reed-Solomon Product-like Code (RSPC) error correction in a substantially real time mode are provided. Two RSPC error correctors are provided in the CD-ROM decoder which perform RSPC error correction over the LSB and MSB of each word respectively. In addition, a 16-bit buffer-memory or a Fast-Page-Mode buffer-memory is provided to store the CD-ROM data temporarily. The LSB and MSB of each word are retrieved from the buffer memory during the same memory cycle and fed to the first and second RSPC error corrector substantially at the same time. The first RSPC error corrector performs the RSPC operation over the LSB. The second RSPC error corrector performs the RSPC operation over the MSB. The respective operations are performed during substantially the same time interval. The invention results in shorter buffer-memory access time and shorter overall RSPC processing time and achieves a substantially real time access of a high speed CD-ROM.

8 Claims, 3 Drawing Sheets

METHOD AND APPARATUS FOR PERFORMING REED-SOLOMON PRODUCT-LIKE DECODING OF DATA IN CD-ROM FORMAT

TECHNICAL FIELD OF INVENTION

The invention relates to the decoding of data from CD-ROM, and, in particular, to REED-SOLOMON product-like decoding of data from CD-ROM.

BACKGROUND OF INVENTION

The following technical information may be further referred to in order to have an in-depth understanding of the background and prior art technology regarding the invention.

1. International Standard ISO/IEC 10149, first edition, 1989-09-01, Global Engineering Documents, Irvin, Calif. 92714, USA.
2. Small Form Factor Committee, Specification of ATA Packet Interface for CD-ROM's, SFF-8020, Revision 1.2, Feb. 24, 1994.
3. SCSI-2 draft proposed American National Standard, Revision 10c.
4. Red book, Compact Disc—Digital Audio(CD-DA), by Sony Corp. and N.V. Philips, April 1987.
5. Yellow book, Compact Disc—Read Only Memory (CD-ROM), by Sony Corp. and N.V. Philips, Nov. 1988.
6. U.S. Pat. No. 5,404,347.
7. U.S. Pat. No. 5,408,477.

A CD-ROM may suffer from physical damage, e.g. a scratch, during production or use. To avoid logically continuous data being lost as a result of the physical damage, during the data-write process of CD-ROM production, a data scramble technique is employed. In short, logically continuous data is first divided into a plurality of partitions according to a predetermined algorithm. Afterwards, another algorithm is employed to scramble the partitions with partitions of other logically continuous data. The resulting scrambled data are then sequentially and continuously written into the physical spaces of the CD-ROM. When, unfortunately, a certain portion of the CD-ROM is damaged, the portion of damaged data belonging to logically continuous data may be recovered by the associated un-damaged data of the respective logically continuous data via the algorithm. Therefore, in addition to the raw data, some extra data including control code, sync code and protection code are added into the raw data to form complete data in the CD-ROM.

As well known in the art, each physical small frame of a CD-ROM has 588 channel bits in which the length of the F1 data frame is 24 bytes, and a sector on the disc consists of 98 small frames. Therefore, the F1 data frames within one sector occupy 2352 bytes of space.

Shown in FIG. 1 is the MODE 1 logical format of one sector on the CD-ROM disc. Other formats includes MODE 2 FORM 1 and MODE 2 FORM 2, as well known in the art. For each logical format of MODE 1, each sector includes 12-byte sync data for synchronizing read operation and 4-byte header data, which indicate the physical address, logic format type, as well as the data code. The data code includes raw data, error detecting code (CRC), auxiliary codes and layered error correction code (ECC). The ECC detects and corrects correctable data errors. As well known in the art, ECC includes P-parity and Q-parity generated by an algorithm involving a REED-SOLOMON product-like code.

The data reading, processing and outputting operations of a small frame on CD-ROM 20 are shown in FIG. 2. The eight-to-fourteen modulated (EFM) data read by the optical head 22 are outputted to the pre-amplifier 24. The amplified EFM data are then outputted to the digital signal processor (DSP) 26. After signal processing, the DSP 26 outputs F1 frame data to the decoder 28.

As shown in FIG. 3, the DSP 26 performs the EFM de-modulation operation 30 of the received data. The output of de-modulation operation 30 is the F3 frame data which has 33 bytes. Within the F3 frame data, there is one control byte. The operation 32 retrieves this control byte and also outputs the residual 32 bytes of F2 frame data. The F2 frame data is then inputted to the cross interleaved REED-SOLOMON code (CIRC) decoder 34 from which F1 frame data, C1 and C2 code are obtained. The C1 and C2 codes are used to indicate the correctness of the F1 frame data. In particular, the C1 code indicates if a correctable error exists in the F1 frame data and C2 code indicates if an un-correctable error exists in the F1 frame data. When a C2 type error does not exist while read operation of one CD-ROM is performed, the reading reliability of the CD-ROM player is assured. The mathematical algorithm employed by CIRC decoder/encoder 34 is conventional and may be referred to in the associated documents regarding the signal processing technology.

As shown in FIG. 4, the CD-ROM decoder 28, responsive to the instruction from an application utility, selectively performs the de-scramble operation 40, C3 type error detection code operation and C3 type error correction code operation on the received F1 frame data of MODE 1 or MODE 2 FORM 1 data format. When none of the mentioned operations is performed, the output is the scrambled data in CD-DA format. When only de-scramble operation 40 is performed, the output is in MODE2 FORM2 format. When all mentioned operations are performed, the output is in either MODE 1 or MODE2 FORM1 format.

The C3 type error correction encoding/decoding is based on a well known REED-SOLOMON PRODUCT-LIKE code (RSPC). In detail, Bytes 12 to 2351 of each sector, totaling 2340 bytes, are ordered in 1170 words of two 8-bit bytes each for RSPC operation. Each word consists of two bytes, one in the position of the most significant byte (MSB) and one in the position of the least significant byte (LSB). According to the conventional approach, the RSPC, operating on bytes, is applied twice by single RSPC encoder/decoder in CD-ROM decoder 28, once to the codeword including the LSBs and once to the codeword including the MSBs. Since RSPC operation of MSBs follows that of LSBs, the traditional approach needs a long memory processing time. Therefore, it is difficult to achieve real time processing of the state-of-art high speed CD-ROM drive.

SUMMARY OF INVENTION

The invention provides a method and apparatus performing the RSPC error correction in a real time mode.

According to the invention, two RSPC error correctors are provided in the CD-ROM decoder. In addition, a 16-bit buffer-memory or a Fast-Page-Mode buffer-memory is provided to store the CD-ROM data temporarily.

The LSB and MSB of each word are retrieved from the buffer memory during the same memory cycle and fed to the first and second RSPC error correctors substantially at the same time.

The first RSPC error corrector performs the RSPC operation over the LSB byte. The second RSPC error corrector performs the RSPC operation over the MSB byte. The respective operations are performed during substantially the same time interval.

The invention results in shorter buffer-memory access and shorter overall RSPC processing time and achieves a substantially real time access of a high speed CD-ROM.

BRIEF DESCRIPTIONS OF APPENDED DRAWINGS

FIG. 1 discloses typical data formats adopted by CD-ROM.

Figure 1:
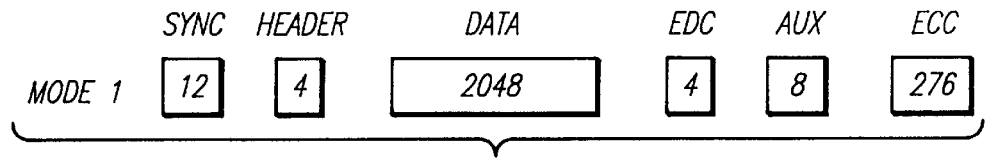
Figure 2:
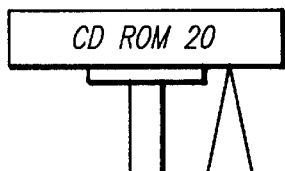
FIG. 2 shows the retrieve operations of the data on CD-ROM by CD-ROM player.
Figure 2:
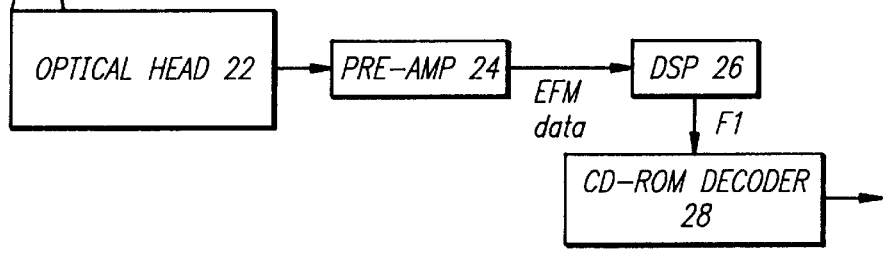
Figure 3:
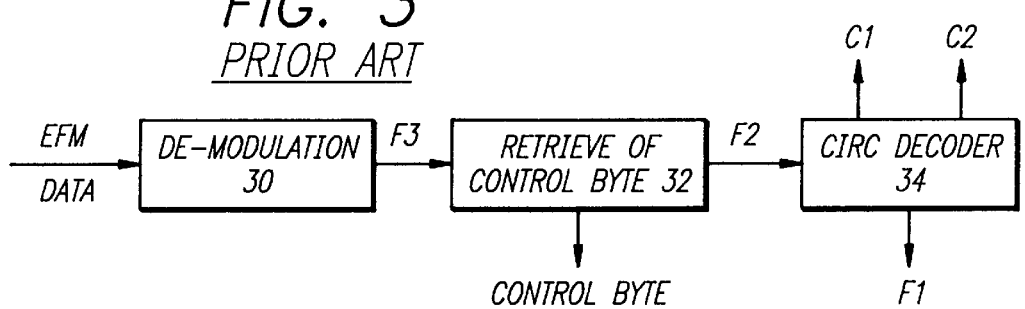
FIG. 3 shows the detailed operations in the digital signal processor (DSP).
Figure 4:
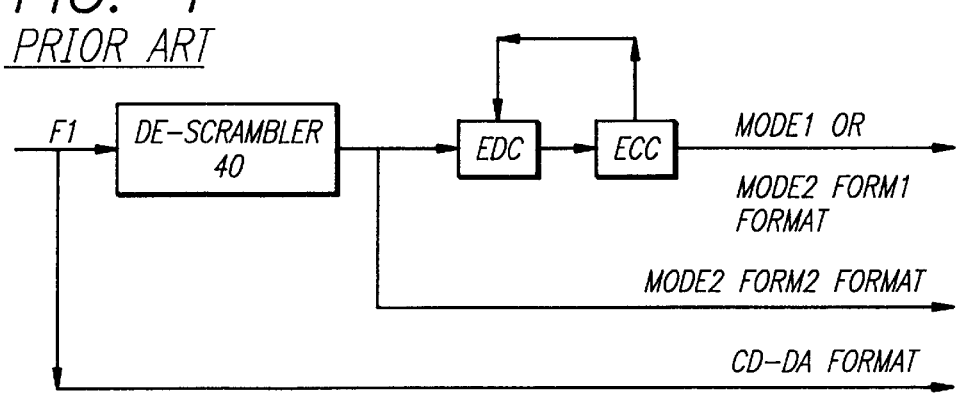
FIG. 4 shows the detailed operations in the CD-ROM decoder.
Figure 5:
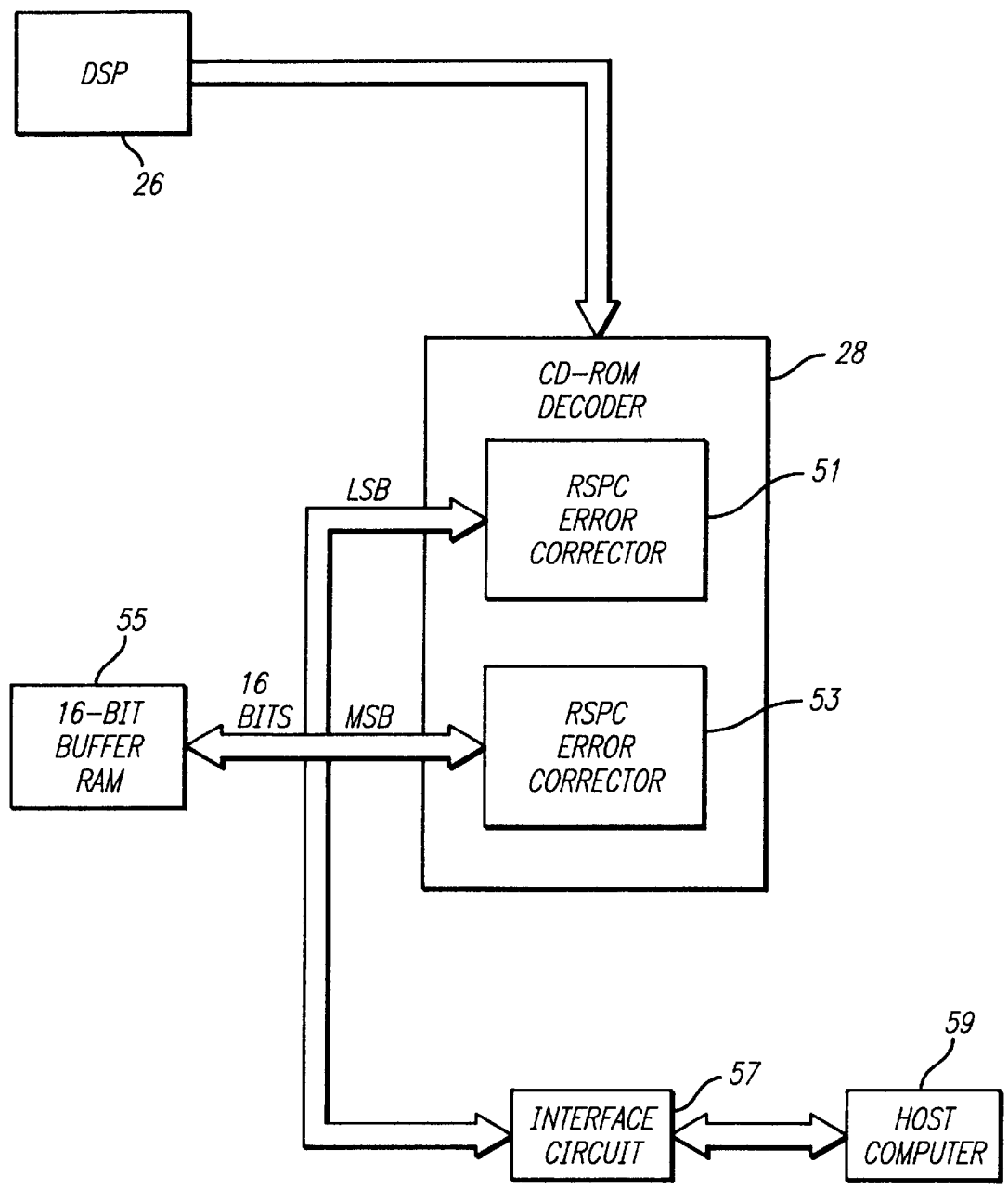

FIG. 5 discloses one preferred embodiment of the present invention.

Figure 6:
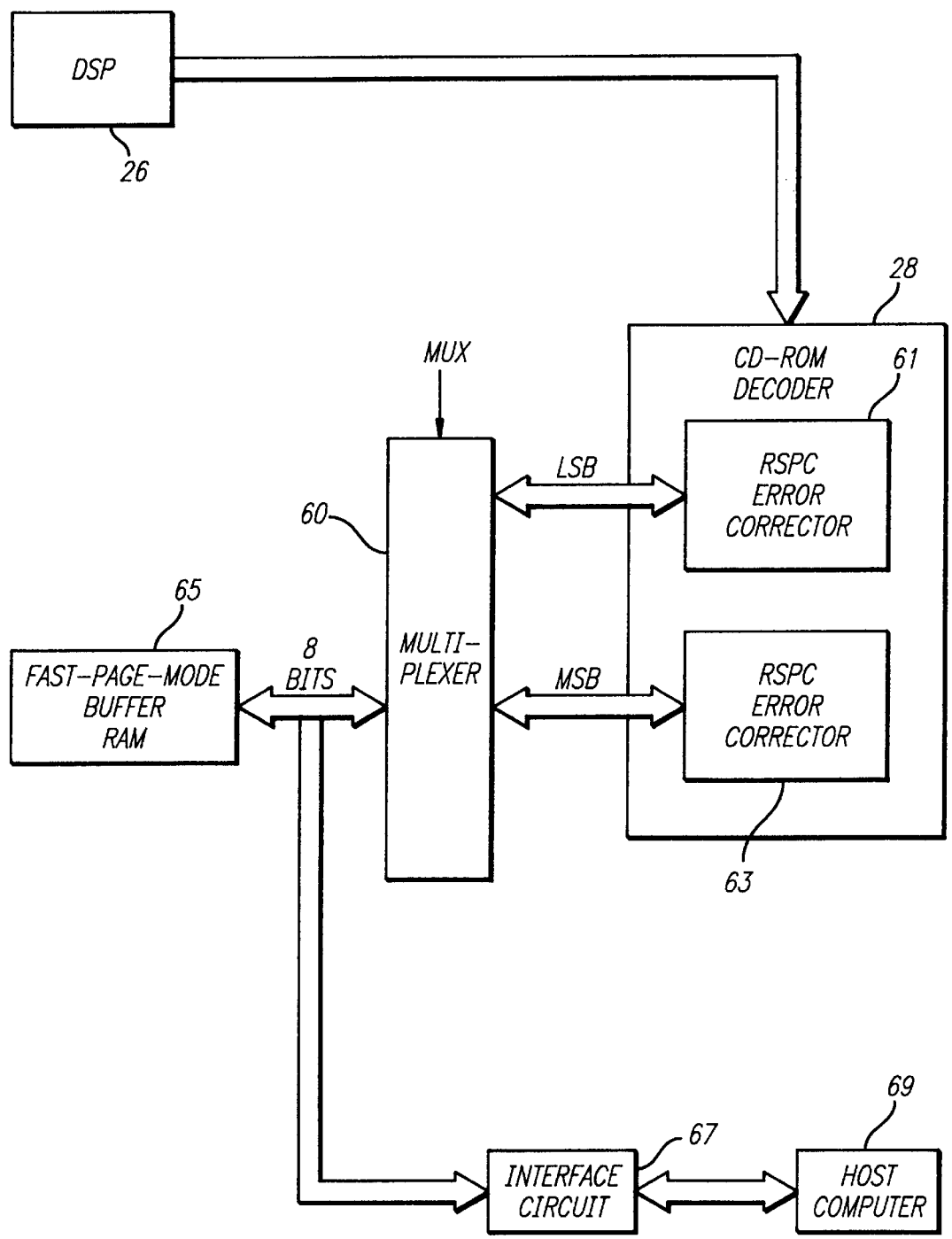

FIG. 6 discloses a second preferred embodiment of the invention.

DETAILED DESCRIPTIONS OF THE PREFERRED EMBODIMENT

As shown in FIG. 5, the CD-ROM decoder 28 according to the invention includes the first RSPC error corrector 51 and second RSPC error corrector 53 which are coupled to a 16-bit buffer memory 55. The first RSPC error corrector 51 receives the LSB of word data from buffer memory 55 and performs the RSPC operation over the LSB. The second RSPC error corrector 53 receives the MSB of word data from buffer memory 55 and performs the RSPC operation over the MSB substantially at the same time as the first RSPC error corrector 51 is performing the RSPC operation over the LSB. The resulting corrected bytes from the first RSPC error corrector 51 and the second RSPC error corrector 53 are respectively output back to the buffer memory 55. The interface circuit 57 transfers a whole data block, including raw data and corrected data, from buffer memory 55 to the host computer 59 later. The interface circuit 57 is coupled to the host computer 59 in a traditional manner.

Since the LSB and MSB of each word are retrieved from the buffer memory 55 during the same memory cycle and fed to the first and second RSPC error correctors 51, 53 substantially at the same time, and the respective RSPC operations are performed by two RSPC error correctors during substantially the same time interval, the invention results in shorter buffer-memory access time and shorter overall RSPC processing time as compared to the conventional approach.

As shown in FIG. 6 which depicts the second embodiment of invention, the CD-ROM decoder 28 according to the invention includes the first RSPC error corrector 61 and second RSPC error corrector 63 which are coupled to a 8-bit Fast-Page-Mode buffer memory 65. In order to input the corresponding byte to the first RSPC error corrector 61 and the second RSPC error corrector 63, a multiplexer 60 is provided which is operated by the control signal MUX. The operation of Fast-Page-Mode memory is well known in the art. The first RSPC error corrector 61 receives the LSB of word data from buffer memory 65 and performs the RSPC operation over the LSB. The second RSPC error corrector 63 receives the MSB of word data from buffer memory 65 and performs the RSPC operation over the MSB substantially at the same time as the first RSPC error corrector 61 is performing the RSPC operation over the LSB. The resulting corrected bytes from the first RSPC error corrector 61 and the second RSPC error corrector 63 are respectively output back to the buffer memory 65. The interface circuit 67 transfers a whole data block, including raw data and corrected data, from buffer memory 65 to the host computer 69 later. The interface circuit 67 is coupled to the host computer 69 in a traditional manner.

Since the LSB and MSB of each word are retrieved from the buffer memory 65 during the same memory cycle and fed to the first and second RSPC error corrector 61, 63 substantially at the same time, and the respective RSPC operations are performed by two RSPC error correctors during substantially the same time interval, the invention results in shorter buffer-memory access time and shorter overall RSPC processing time as compared to the conventional approach.

What is claimed is:

1. A decoder for performing REED-SOLOMON product-like code (RSPC) decoding of sector data in a CD-ROM format, in a CD-ROM player including a buffer memory for storing the sector data, the sector data being ordered in a plurality of words, each word including a least significant byte (LSB) and a most significant byte (MSB), comprising:

a first RSPC error corrector adapted to receive the LSB during a first time interval;

a second RSPC error corrector adapted to receive the MSB substantially during the first time interval;

wherein the first RSPC error corrector performs the RSPC decoding operation over the LSB during a second time interval, and the second RSPC error corrector performs the RSPC decoding operation over the MSB substantially during the second time interval.

2. The decoder of claim 1, wherein the buffer memory is a 16-bit buffer memory, and the 16-bit buffer memory outputs the LSB and MSB during the first time interval.

3. The decoder of claim 1, wherein the buffer memory is a 8-bit Fast-Page-Mode buffer memory, and the 8-bit Fast-Page-Mode buffer memory outputs the LSB and MSB substantially during the first time interval.

4. The decoder in a CD-ROM player of claim 3, wherein the CD-ROM player further comprises:

a multiplexer, coupled to the 8-bit Fast-Page-Mode buffer memory, for selectively outputting the LSB and the MSB to the first RSPC error corrector and the second RSPC error corrector respectively.

5. A method for performing REED-SOLOMON product-like decoding of sector data in a CD-ROM format, in a CD-ROM player including a buffer memory for storing the sector data, the sector data being ordered in a plurality of words, each word including a least significant byte (LSB) and a most significant byte (MSB), comprising the steps of:

(a) outputting the LSB and MSB from the buffer memory substantially during a first time interval;

(b) performing RSPC decoding over the LSB by a first RSPC error corrector during a second time interval, and performing RSPC decoding over the MSB by a second RSPC error corrector substantially during the same second time interval.

6. The method of claim 5, wherein the buffer memory is a 16-bit buffer memory, and the outputting of the LSB and MSB is from the 16-bit buffer memory during the first time interval.

7. The method of claim 5, wherein the buffer memory is a 8-bit Fast-Page-Mode buffer memory, and the outputting of the LSB and MSB is from the 8-bit Fast-Page-Mode buffer substantially during the first time interval.

8. The method of claim 7, wherein the CD-ROM player further comprises a multiplexer, coupled to the 8-bit Fast-Page-Mode buffer memory, and the outputting of the LSB and MSB is selectively from the multiplexer for the LSB and the MSB to the first RSPC error corrector and the second RSPC error corrector respectively.

* * * * *